US011966171B2

(12) United States Patent
Devilliers

(10) Patent No.: US 11,966,171 B2
(45) Date of Patent: Apr. 23, 2024

(54) METHOD FOR PRODUCING OVERLAY RESULTS WITH ABSOLUTE REFERENCE FOR SEMICONDUCTOR MANUFACTURING

(71) Applicant: Tokyo Electron Limited, Tokyo (JP)

(72) Inventor: Anton J. Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 332 days.

(21) Appl. No.: 17/404,566

(22) Filed: Aug. 17, 2021

(65) Prior Publication Data

US 2022/0051951 A1 Feb. 17, 2022

Related U.S. Application Data

(60) Provisional application No. 63/066,779, filed on Aug. 17, 2020.

(51) Int. Cl.
*G03F 7/00* (2006.01)
*G03F 9/00* (2006.01)
(Continued)

(52) U.S. Cl.
CPC ...... *G03F 7/70633* (2013.01); *G03F 7/70466* (2013.01); *G03F 7/7065* (2013.01); *G03F 7/70683* (2013.01); *G03F 7/7085* (2013.01); *G03F 9/7046* (2013.01); *G03F 9/7073* (2013.01); *G03F 9/7084* (2013.01); *G03F 9/7088* (2013.01); *G06T 7/001* (2013.01); *G06T 7/337* (2017.01); *G06T 7/74* (2017.01);
(Continued)

(58) Field of Classification Search
CPC ............. G03F 7/70466; G03F 7/70633; G03F 7/7065; G03F 7/70683; G03F 7/7085; G03F 9/7046; G03F 9/7073; G03F 9/7084; G03F 9/7088; G01N 21/95607; G06V 10/245; G06V 2201/06; G06T 2207/10048; G06T 2207/10061; G06T 2207/10152; G06T 2207/30148; G06T 7/001; G06T 7/337; G06T 7/74; H01L 22/20; H01L 2223/54426; H01L 23/544; H04N 23/56
See application file for complete search history.

(56) References Cited

U.S. PATENT DOCUMENTS

| | | | |
|---|---|---|---|
| 6,582,376 | B2 | 6/2003 | Baghdassarian |
| 6,658,032 | B2 | 12/2003 | Wiemeyer |

(Continued)

FOREIGN PATENT DOCUMENTS

| | | | |
|---|---|---|---|
| JP | 2012195380 A | * | 10/2012 |
| WO | WO 2019/139390 A1 | | 7/2019 |

OTHER PUBLICATIONS

International Search Report and Written Opinion dated Nov. 29, 2021 in PCT/US2021/046354, 9 pages.

*Primary Examiner* — Peter B Kim
(74) *Attorney, Agent, or Firm* — Oblon, McClelland, Maier & Neustadt, L.L.P.

(57) ABSTRACT

A method of processing a wafer is provided. The method includes providing a reference pattern for patterning a wafer. The reference pattern is independent of a working surface of the wafer. A placement of a first pattern on the working surface of the wafer is determined by identifying the reference pattern to align the first pattern. The first pattern is formed on the working surface of the wafer based on the placement.

20 Claims, 7 Drawing Sheets

(51) Int. Cl.

| | |
|---|---|
| ***G06T 7/00*** | (2017.01) |
| ***G06T 7/33*** | (2017.01) |
| ***G06T 7/73*** | (2017.01) |
| ***G06V 10/24*** | (2022.01) |
| ***H01L 21/66*** | (2006.01) |
| ***H01L 23/544*** | (2006.01) |
| *G01N 21/956* | (2006.01) |
| *H04N 23/56* | (2023.01) |

(52) U.S. Cl.

CPC ............ *G06V 10/245* (2022.01); *H01L 22/20* (2013.01); *H01L 23/544* (2013.01); *G01N 21/95607* (2013.01); *G06T 2207/10048* (2013.01); *G06T 2207/10152* (2013.01); *G06T 2207/30148* (2013.01); *G06V 2201/06* (2022.01); *H01L 2223/54426* (2013.01); *H04N 23/56* (2023.01)

(56) References Cited

U.S. PATENT DOCUMENTS

| | | | | |
|---|---|---|---|---|
| 7,004,909 | B1 | 2/2006 | Patel et al. | |
| 7,064,329 | B2 | 6/2006 | Webber | |
| 7,473,229 | B2 | 1/2009 | Webber | |
| 7,502,115 | B2 | 3/2009 | Patel et al. | |
| 7,684,039 | B2 | 3/2010 | Adel et al. | |
| 7,903,704 | B2 | 3/2011 | Patel et al. | |
| 8,014,430 | B2 | 9/2011 | Patel et al. | |
| 8,068,524 | B1 | 11/2011 | Patel et al. | |
| 8,121,164 | B1 | 2/2012 | Lyakh et al. | |
| 8,247,775 | B2 | 8/2012 | Patel et al. | |
| 8,360,974 | B2 | 1/2013 | Patel et al. | |
| 8,994,947 | B2 | 3/2015 | Patel et al. | |
| 9,077,153 | B2 | 7/2015 | Maulini et al. | |
| 9,285,310 | B2 | 3/2016 | Patel et al. | |
| 9,608,408 | B2 | 3/2017 | Lyakh et al. | |
| 10,230,210 | B2 | 3/2019 | Patel et al. | |
| 10,473,460 | B2 | 11/2019 | Gutman et al. | |
| 10,705,436 | B2 | 7/2020 | Wen et al. | |
| 10,998,690 | B2 | 5/2021 | Patel et al. | |
| 11,050,220 | B2 | 6/2021 | Barron-Jimenez et al. | |
| 11,630,397 | B2 * | 4/2023 | Devilliers | G03F 7/70466 356/509 |
| 11,640,118 | B2 * | 5/2023 | Devilliers | G03F 9/7046 430/394 |
| 2006/0023214 | A1 * | 2/2006 | Lof | G03F 9/7015 356/401 |
| 2007/0187606 | A1 | 8/2007 | Adel et al. | |
| 2016/0282730 | A1 | 9/2016 | Sasaki | |
| 2019/0178639 | A1 | 6/2019 | Gutman et al. | |
| 2020/0103763 | A1 | 4/2020 | Wen et al. | |

* cited by examiner

METHOD FOR PRODUCING OVERLAY RESULTS WITH ABSOLUTE REFERENCE FOR SEMICONDUCTOR MANUFACTURING

INCORPORATION BY REFERENCE

This present disclosure claims the benefit of U.S. Provisional Application No. 63/066,779, filed on Aug. 17, 2020, the entire content of which is incorporated herein by reference.

FIELD OF THE INVENTION

This disclosure relates generally to methods of fabricating semiconductor devices and specifically to overlay error and pattern alignment.

BACKGROUND

Semiconductor fabrication involves multiple varied steps and processes. One typical fabrication process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be constructed using semiconductor fabrication techniques including photolithography, etching, film deposition, surface cleaning, metallization, and so forth.

Microfabrication involves forming and processing multiple films and layers on a wafer. This can include dozens or more films stacked on a wafer. Patterns applied to the wafer for various films and layers need to be aligned to previously-formed patterns. Conventionally, such alignment is realized by using part of the wafer to form alignment marks and scribe lines. However, the present inventors have recognized that the various film deposition, etching, and treatment techniques at times cover the alignment marks and even completely remove the alignment marks. With alignment marks at times covered or missing, there can be errors applying subsequent patterns on the wafer. The term overlay or overlay error refers to the difference between placement of given pattern relative to a previously-placed pattern. With alignment marks routinely destroyed, overlay error can accumulate with additional layers, which can cause poor performance and device error.

SUMMARY

The present disclosure relates to a method of processing a wafer.

An aspect (1) includes a method of processing a wafer. The method includes providing a reference pattern for patterning a wafer. The reference pattern is independent of the working surface of the wafer. A placement of a first pattern on the working surface of the wafer is determined by identifying the reference pattern to align the first pattern. The first pattern is formed on the working surface of the wafer based on the placement.

An aspect (2) includes the method of the aspect (1), wherein determining the placement of the first pattern further includes capturing an image of the reference pattern and an image of the first pattern. Image analysis is performed to calculate an overlay value to determine the placement of the first pattern.

An aspect (3) includes the method of the aspect (2), further including identifying coordinate locations of the first pattern relative to the reference pattern.

An aspect (4) includes the method of the aspect (1), further including determining a placement of a second pattern on the working surface of the wafer by identifying the reference pattern to align the second pattern. The second pattern is formed on the working surface of the wafer.

An aspect (5) includes the method of the aspect (4), wherein determining the placement of the second pattern further includes identifying first coordinate locations of the first pattern relative to the reference pattern. Second coordinate locations of the second pattern relative to the reference pattern are identified. An overlay value is calculated using the first coordinate locations and the second coordinate locations. The second pattern is aligned using the overlay value.

An aspect (6) includes the method of the aspect (1), further including forming a stack of patterns on the working surface of the wafer, wherein placements of the stack of patterns are determined using the reference pattern.

An aspect (7) includes the method of the aspect (6), further including identifying coordinate locations of each pattern of the stack of patterns relative to the reference pattern. Overlay values are calculated using the coordinate locations. The stack of patterns is aligned using the overlay values.

An aspect (8) includes the method of the aspect (1), wherein the reference pattern is incorporated in a reference plate positioned below the wafer.

An aspect (9) includes the method of the aspect (8), further including capturing an image of the reference pattern and an image of the first pattern simultaneously.

An aspect (10) includes the method of the aspect (9), further including capturing the image of the reference pattern via quantum tunneling imaging or infrared (IR) transmission imaging.

An aspect (11) includes the method of the aspect (8), wherein the reference plate is incorporated in a substrate holder of a photolithography scanner or stepper.

An aspect (12) includes the method of the aspect (8), wherein the reference plate is placed on or adhered to a backside of the wafer An aspect (13) includes the method of the aspect (1), wherein the reference pattern is formed on a backside of the wafer or embedded within the wafer.

An aspect (14) includes the method of the aspect (13), further including capturing an image of the reference pattern and an image of the first pattern simultaneously. The image of the reference pattern is captured via quantum tunneling imaging or IR transmission imaging.

An aspect (15) includes the method of the aspect (1), wherein the reference pattern includes a radioactive or fluorescent material.

An aspect (16) includes the method of the aspect (1), wherein the reference pattern includes at least one of a point, a line, a corner, a box, a triangle, a number or a mark.

An aspect (17) includes the method of the aspect (1), wherein the reference pattern is coaxially aligned with the wafer.

An aspect (18) includes the method of the aspect (1), wherein the reference pattern is projected on a surface of the wafer.

An aspect (19) includes a method of processing a wafer. The method includes accessing a reference pattern for patterning the wafer. The reference pattern is independent of a first pattern formed on the wafer. First coordinate locations of the first pattern relative to the reference pattern are identified. Second coordinate locations of a second pattern relative to the reference pattern are identified. An overlay value is calculated using the first coordinate locations and the second coordinate locations.

An aspect (20) includes the method of the aspect (19), wherein identifying the first coordinate locations and the second coordinate locations includes using image analysis.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
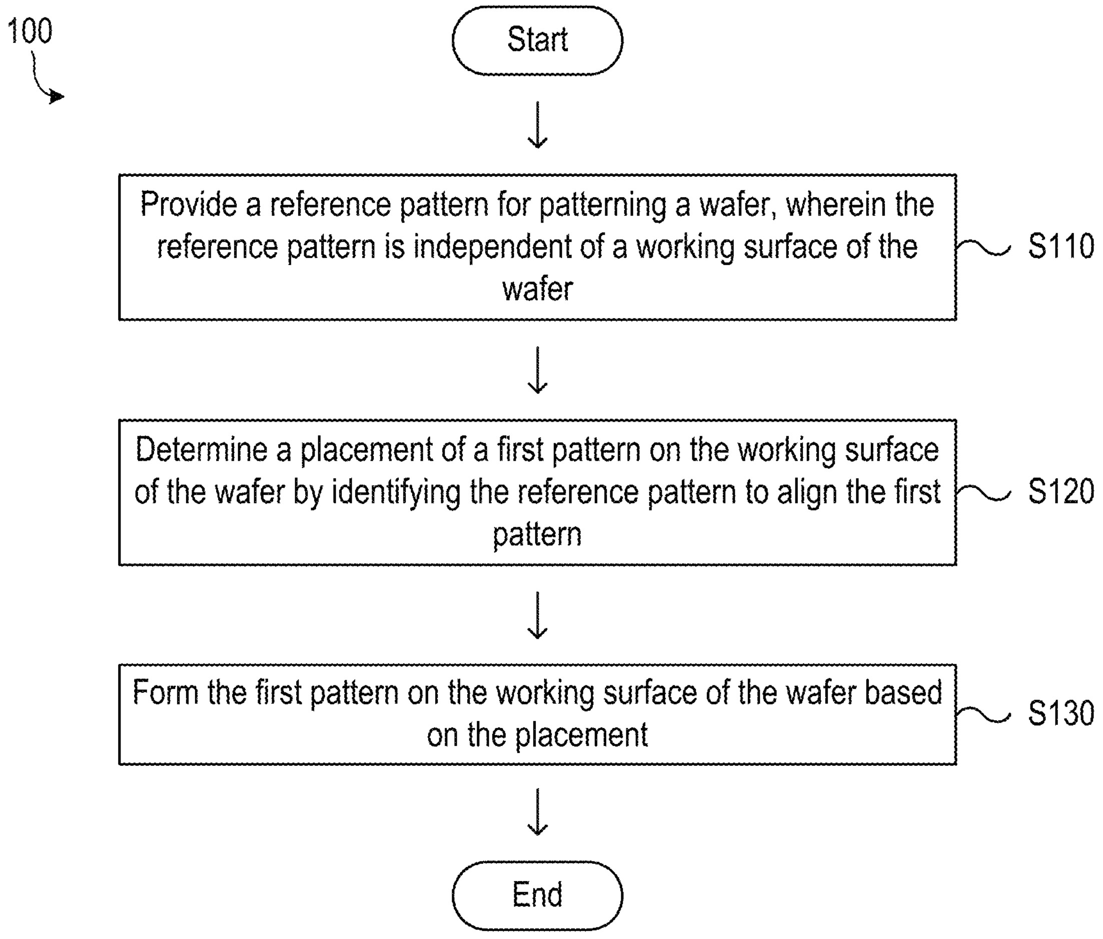
FIG. 1 shows a flow chart of an exemplary process for processing a wafer, in accordance with exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Techniques herein use an absolute reference, that is, a reference independent of the wafer or patterns stacked on the wafer. Each pattern applied to the wafer can be aligned to this independent reference instead of being based on a previous pattern. This method can prevent overlay walkout and accumulation of overlay error.

This disclosure reveals some embodiments in which an apparatus or tool to see through a semiconductor wafer to image a pattern within or below the wafer. This see-through technology can be used to compare a pattern or reference below or within the wafer with a pattern on a working surface (e.g., a top surface or a front side) of the wafer.

Techniques herein include an imaging system that can coaxially align two light beams of different wavelengths, focus the two coaxially aligned light beams onto a first pattern located on a top surface of a substrate and a second pattern positioned below the first pattern, and capture images of the first and second patterns. For example, the imaging system can include a first light source, a second light source, an alignment module, a coaxial module, a first image capturing device, and a second image capturing device.

Techniques include a coaxial imaging system. In some embodiments, a first wavelength light such as ultraviolet (UV) wavelength light is directed at a target on a wafer coaxially with a second wavelength light such as infrared (IR) light. Image sensors capture images resulting from both the UV light and the IR light. With images captured in a same axis and superimposed, a comparison can be made for exposure, inspection, alignment or other processing. Although the UV and IR images are captured coaxially, transmission to an image detector may or may not be coaxial. For example, the coaxially captured images may be optically separated and transmitted to separate image detectors as discussed below.

This present disclosure discloses a method for wafer alignment and see-through wafer alignment detection. Techniques herein use a light source with a wavelength and power sufficient to tunnel through wafer material to image alignment marks within the wafer or beneath the wafer. This see-through imaging provides an accurate and precise alignment mechanism that does not rely on conventional alignment marks formed on a working surface (e.g., top surface or a front side) of a wafer. Instead, with reference to a pattern or grid within/below the wafer, a reliable reference can be repeatedly accessed for precise and accurate registration and alignment of subsequent patterns.

Techniques herein use see-through wafer technology for wafer inspection and detection. Systems and methods herein can identify overlay error and defects in wafers including inspection relative to a reference pattern and inspection of intermediate layers. In some embodiments, intermediate layers may be inspected by use a light source with a wavelength and power sufficient to tunnel through wafer material and focus on a patterned layer formed in the wafer but covered by subsequent wafer processing.

With techniques herein, it is no longer necessary to create and re-create alignment marks. Conventionally there is no independent grid or plate reference. All overlay corrections then must account for different tools and corrections signatures. Also, there is no independent reference point for an initial pattern placed on a fresh wafer. Instead, an initial pattern is placed on a new wafer and assumed to be perfect, as if it were formed using a golden tool. In reality, however, this foundation on blind trust is flawed. There are many factors that can affect the initial pattern, such as drive motor precision and calibration curve errors among others. As such, distortion maps are used from the outset. And then moving from mark A to mark B or from layer to layer creates and compounds overlay error.

Figure 2B:
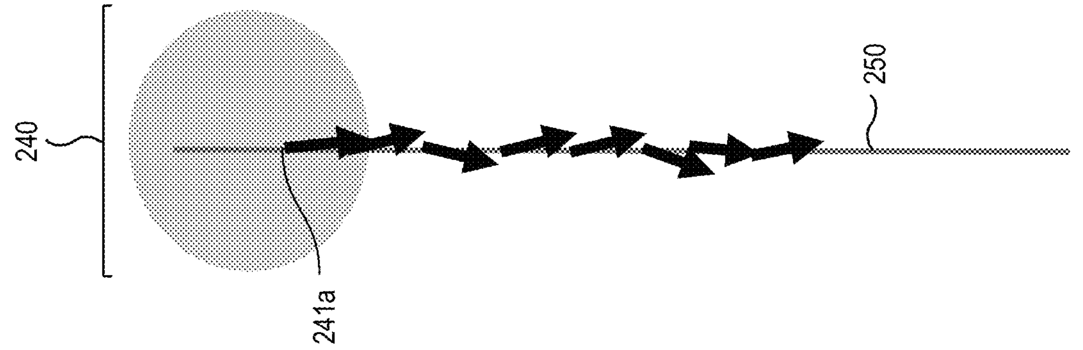
FIG. 2B shows overlay alleviation using a reference pattern, in accordance with exemplary embodiments of the present disclosure.
Figure 2A:
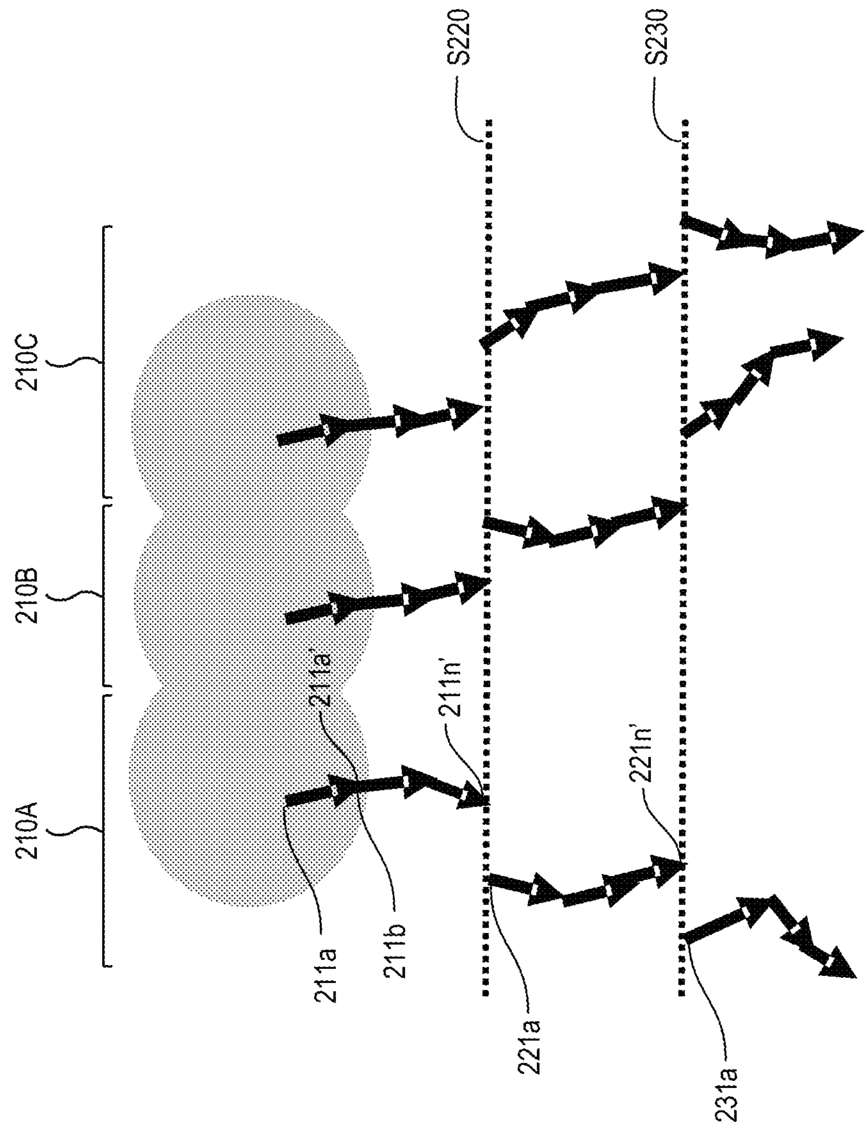
FIG. 2A shows an industrial problem of overlay.

FIG. 2A illustrates an industrial problem of overlay. Each arrow herein has a starting point (e.g. 211*a*), which corresponds to a position of a preceding pattern, and an endpoint or arrowhead (e.g. 211*a*'), which corresponds to a position of a subsequent pattern. As a result, each arrow represents an overlay value or overlay error when the subsequent pattern is formed over or side by side with the corresponding preceding pattern. In a process 210A for example, there is no grid or plate reference when placing an initial pattern. Thus, a starting point 211*a* of a first arrow is likely to be misaligned, that is, the initial pattern can have placement error, for example relative to an edge of the wafer. Then subsequent patterns try to align based on the corresponding last pattern. As illustrated in FIG. 2A, a starting point (e.g. 211*b*) of a subsequent arrow overlaps with an arrowhead (e.g. 211*a*') of a corresponding last or preceding arrow. In some examples, deterioration of alignment marks can cause alignment error for subsequent patterns placed by using such deteriorated alignment marks. Note that even in a theoretically perfect system, walkout can still occur. For example, if a system pattern placement tolerance is +/−4 nm and each level references a previous level. Take a reference level to be 0 error. A first layer then could be +4 nm off. A second layer alignment to the first layer could be +4 nm off, meaning the second layer is now +8 nm off the reference level. There are also process factors that induce or relieve stress throughout fabrication that can induce walkout/alignment shift even with pristine alignment marks visible that can add to accumulated error.

Further, alignment marks may be destroyed at a step S220 in a process, and placement again happens without a reference mark. Similar to the starting point 211*a*, a starting point 221*a* of a new arrow is likely to be misaligned. In the example of FIG. 2A, the starting point 221*a* deviates from an arrowhead 211*n*'. The process proceeds by aligning subsequent patterns based on the corresponding last pattern until alignment marks are destroyed again at a step S230. Similarly, placement happens without a reference mark, and a starting point 231*a* deviates from an arrowhead 221*n*'. As can be seen in FIG. 2A, as layers increase, the overlay error can accumulate, leading to poor manufacturing yields, device error, etc. Note that the process 210A is a non-limiting example. Other processes (e.g. 210B and 210C) may have different overlay values (different arrows) and/or different steps.

FIG. 2B shows overlay alleviation using a reference pattern, in accordance with exemplary embodiments of the present disclosure. While not shown, with techniques herein, all patterns placed on a wafer are based on a same reference pattern. In some embodiments, a reference grid can be used and considered absolute, or rather, independent of any patterns on the wafer. In one embodiment, the (independent) reference grid is compared to the wafer when placing a new pattern. For an initial pattern, this means that the pattern can be fitted to the reference grid. For subsequent patterns, this means that one or more patterns can be compared to the reference grid to calculate overlay correction to return to same alignment.

For example, in a process 240, a reference pattern (not shown) is used to align an initial pattern on a wafer. In one embodiment, the reference pattern can be provided in a fixed position relative to the wafer surface such as by bonding the reference to a backside of the wafer or embedding the pattern within the wafer. Consequently, a starting point 241*a* of a first arrow is aligned to the fixed reference pattern, whose position is demonstrated as a line 250. Subsequent patterns are also aligned using the reference pattern. A new photoresist layer may be formed for each subsequent pattern, but no alignment marks need to be formed and/or destroyed on the wafer because of the reference pattern. As a result, arrows center around the line 250, meaning that the subsequent patterns are aligned to the reference pattern. Overlay error is therefore unlikely to accumulate as more and more layers are formed. Note that in some embodiments, the reference pattern is positioned below a working surface (e.g., a top surface or a front side) of the wafer, on which the subsequent patterns are formed. Hence, the reference pattern is independent of the working surface of the wafer. In other words, the reference pattern is not affected by lithographic processes, such as etching, deposition, chemical mechanical polishing and the like, which are performed on the working surface of the wafer in order to form patterns.

Figure 3A:
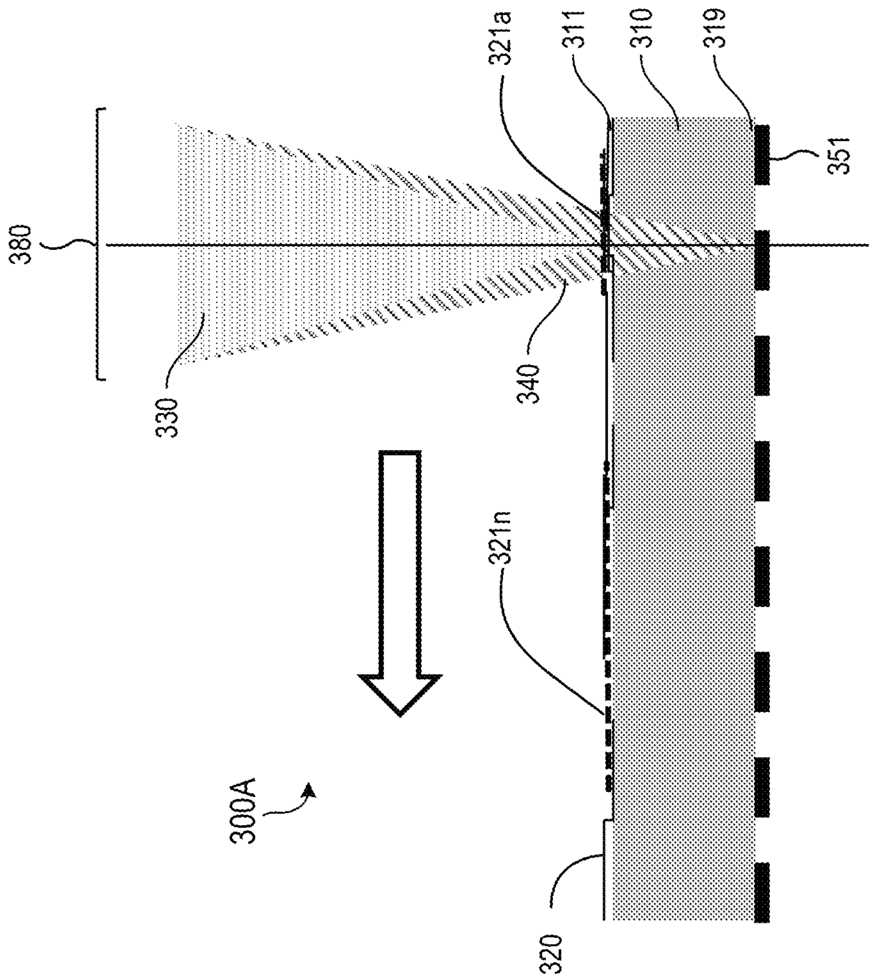
FIG. 3A shows a schematic of aligning a wafer using a reference pattern, in accordance with exemplary embodiments of the present disclosure.

FIG. 3A shows a schematic 300A of aligning a wafer using a reference pattern, in accordance with exemplary embodiments of the present disclosure. As shown, a wafer 310 has a front side 311 (also referred to as a working surface) and a backside 319. In the example of FIG. 3A, an imaging system 380 is used to image a resist layer 320 formed on the front side 311 and a reference pattern 351 positioned on the backside 319.

As illustrated in FIG. 3A, the imaging system 380 includes a first beam of light 330 that is used to image a topside pattern (e.g. 321*a*) on the front side 311 of the wafer 310. The imaging system 380 also includes a second beam of light 340 that is configured to tunnel through the wafer 310 in order to image the reference pattern 351. The first beam of light 330 and the second beam of light 340 are configured to be co-axially aligned so that an image of the topside pattern captured by the first beam of light 330 and an image of the reference pattern 351 captured by the second beam of light 340 can be analyzed to determine where the topside pattern is positioned, relative to the reference pattern 351.

In some embodiments, the image of a pattern and the image of the reference pattern 351 are analyzed so that coordinate locations of the pattern relative to the reference pattern 351 can be determined. For example, the images may be superimposed in the same physical space, or effectively superimposed by comparing coordinate location data collected from the reference pattern 351 and the pattern to perform vector analysis for determining gross offset. As a result, the pattern can be aligned using the reference pattern 351. Alignment may occur, for example, by moving a mask of the pattern image or moving the wafer relative to a fixed mask. In some embodiments, the resist layer 320 is exposed and a latent pattern 321*a* is formed in the resist layer 320. In one embodiment, the latent pattern 321*a* is then developed, and a physical pattern is thus formed in the resist layer 320. In another embodiment, in a "step-and-repeat" or "step-and-scan" system, the two beams of light and the photomask may move to another area of the wafer 310 as indicated by the hollow arrow in FIG. 3A, and the process is repeated to form one or more latent patterns (e.g. 321*n*) in the resist layer 320. Under this circumstance, latent patterns are exposed separately but will be developed together.

While not shown in FIG. 3A, the imaging system 380 may further include alignment optics in addition to sensors or cameras for capturing images resulting from the first beam of light 330 and the second beam of light 340. The alignment optics are configured such that the first beam of light 330 and the second beam of light 340 are coaxially aligned for imaging different planes. In other words, the imaging system 380 can coaxially align two light beams of different wavelengths (e.g. 330 and 340), focus the two coaxially aligned light beams onto a topside pattern (e.g. 321*a*) located on the front side 311 of the wafer 310 and a reference pattern (e.g. 351) positioned below the topside pattern (e.g. 321*a*), and capture images of the topside pattern (e.g. 321*a*) and the reference pattern (e.g. 351).

Figure 3B:
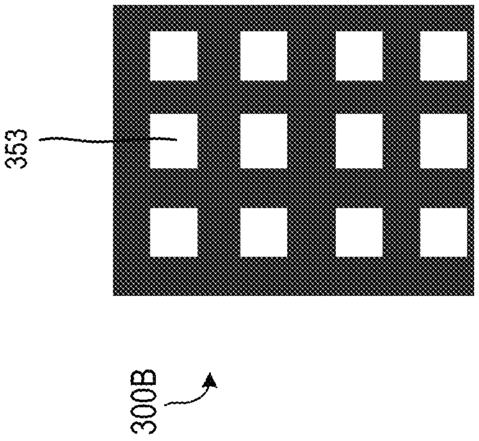
FIG. 3B shows a reference plate, in accordance with exemplary embodiments of the present disclosure.

Still referring to FIG. 3A, the reference pattern 351 is positioned on the backside 319 of the wafer 310. In one embodiment, the reference pattern 351 is formed on the backside 319 of the wafer 310 and thus fixed to the wafer throughout processing of that wafer. In another embodiment, the reference pattern 351 is incorporated in a reference plate, such as a reference plate 300B as demonstrated in FIG. 3B. In the example of FIG. 3B, the reference plate 300B is a grid plate with 20 micron by 20 micron squares (e.g. 353), nearly perfectly aligned. In this embodiment, the precision of the grid plate will determine the alignment capabilities of a patterning or inspection system. Accordingly, the grid plate should be obtained from a manufacturer capable of forming the grid plate within predetermined degree of manufacturing tolerance. Alternatively, the reference plate 300B may include at least one of a point, a line, a corner, a box, a number, a mark or any other pattern that is suitable for alignment purposes. The reference plate 300B may be adhered to the backside 319 of the wafer 310 or incorporated in a substrate holder of a photolithography tool such as a scanner or stepper.

While the reference pattern 351 is positioned on the backside 319 of the wafer 310 in the FIG. 3A example, the reference pattern 351 may be placed within the wafer 310 in another example. That is, the reference pattern 351 is placed below the front side 311 of the wafer 310, whether below or within the wafer 310, such that the reference pattern 351 is independent of the front side 311 of the wafer 310 and the resist layer 320. Moreover, the reference pattern 351 is independent of any pattern (e.g. 321*a*) formed or to be formed on the front side 311 of the wafer 310.

In a non-limiting example, a photomask (not shown) that includes a pattern is positioned on the front side 311 of the wafer 310. The photomask may be placed in direct contact with the wafer 310 in a contact printing system. The photomask may be placed away from the wafer 310 in a proximity printing system or in a projection printing system. Before printing the pattern on the wafer 310, the photomask, or rather, the pattern is aligned using image analysis that is enabled by the reference pattern 351 and the imaging system 380.

In one embodiment, the pattern is an initial pattern and can therefore be aligned to the reference pattern. For example, the reference pattern may include grids of lines such that the pattern is aligned to the grids of lines. In another embodiment, the pattern is a subsequent pattern which is placed over or side by side with a preceding pattern. In some embodiments, in order to align the subsequent pattern, the preceding pattern is imaged relative to the reference pattern using the imaging system 380, and the subsequent pattern is also imaged relative to the reference pattern using the imaging system 380. An overlay value of the second pattern relative to the first pattern may then be determined. Further details regarding image analysis and overlay calculation will be explained in FIGS. 4A-4D.

Figure 4A:
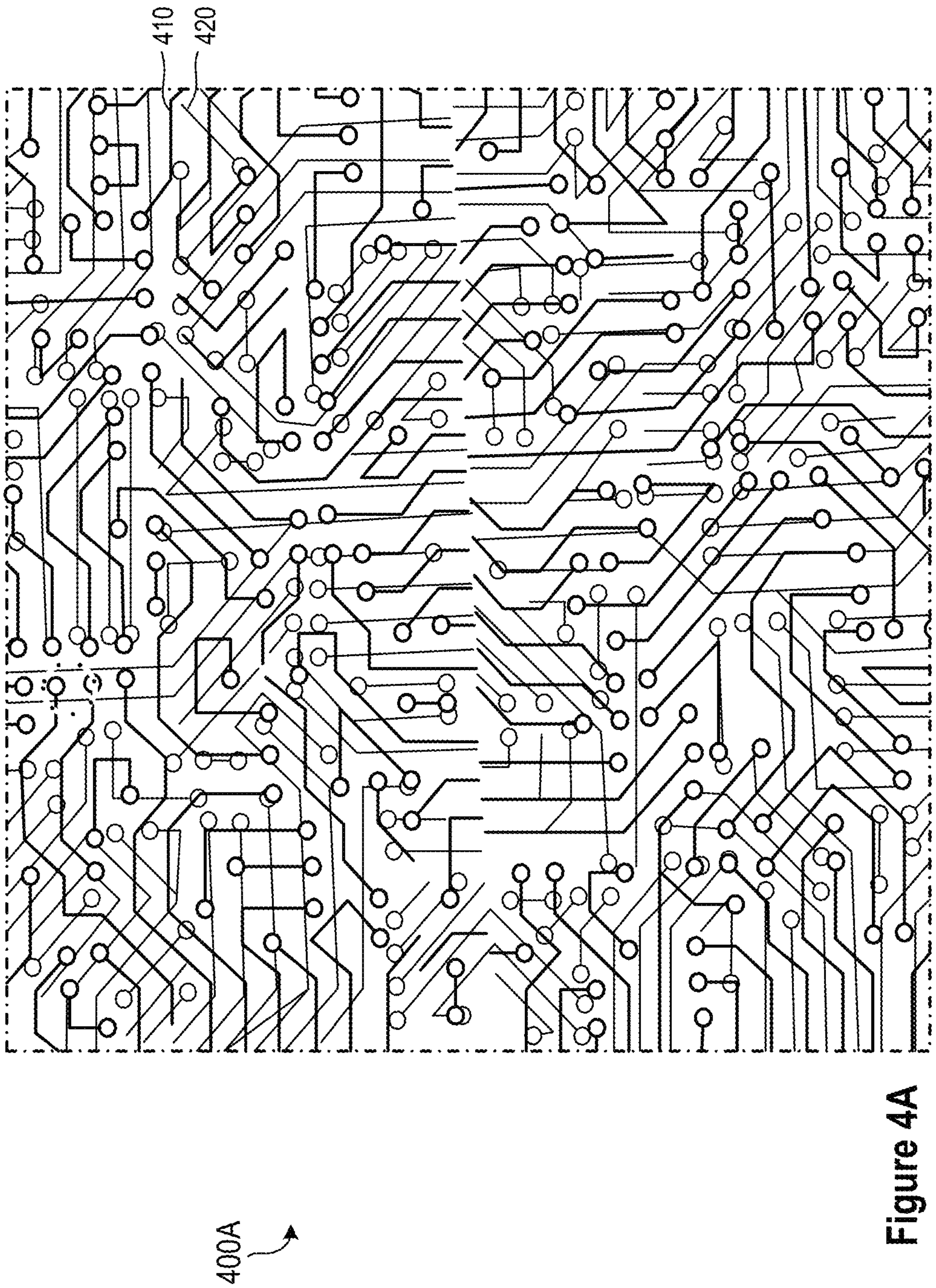
FIGS. 4A and 4B show image analysis without and with a reference pattern, respectively, in accordance with exemplary embodiments of the present disclosure.
Figure 4B:
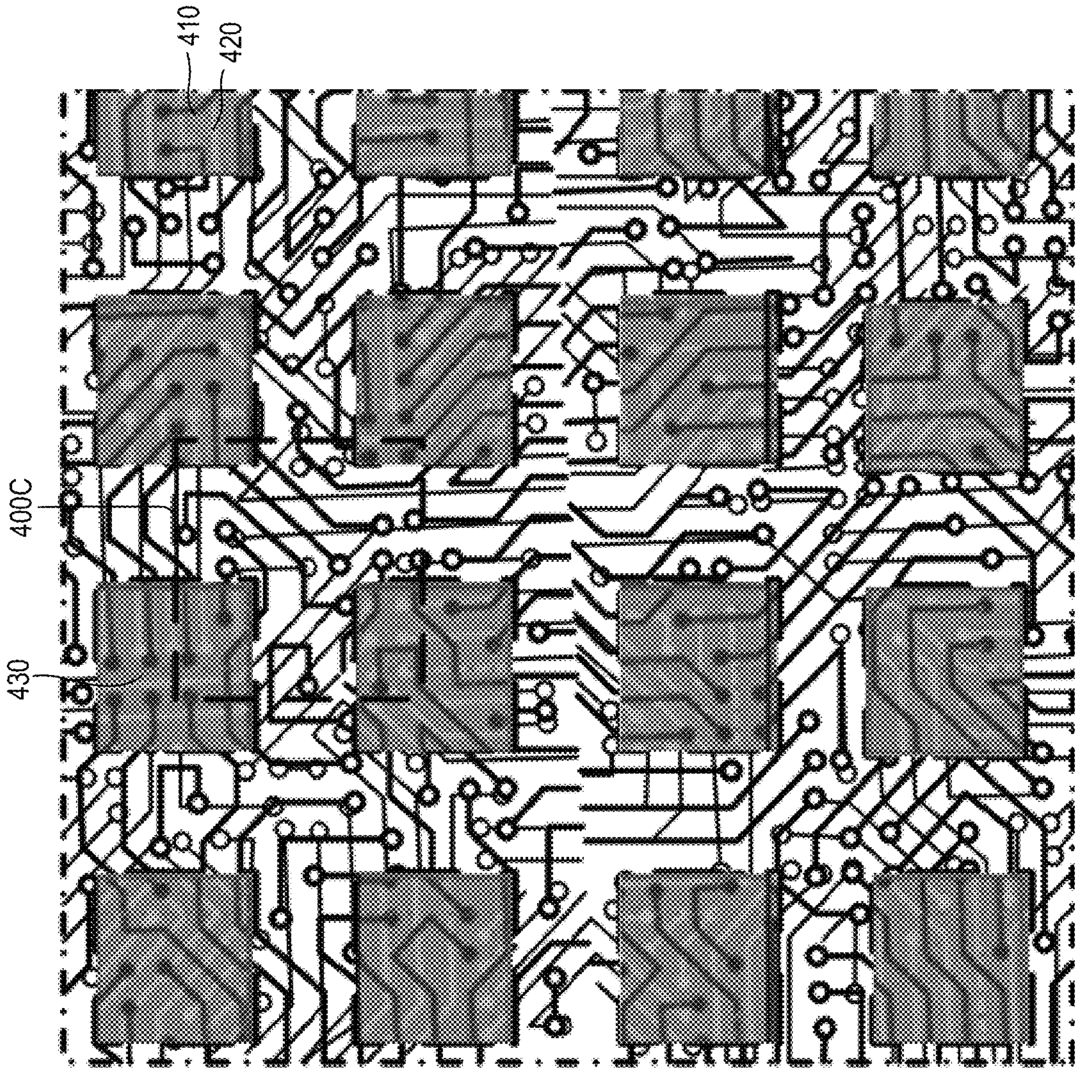

FIGS. 4A and 4B show image analysis without and with a reference pattern, respectively, in accordance with exemplary embodiments of the present disclosure. In FIG. 4A, images of two patterns are superimposed on each other, resulting in an image 400A. In this example, the image 400A includes a plurality of lines and dots from a first pattern represented in black (e.g. 410), as well as lines and dots of a second pattern represented in gray (e.g. 420). This figure demonstrates that it can be difficult to accurately align the lines and the dots of one pattern to the lines and the dots of the other pattern without a reference pattern.

The embodiment of an image 400B in FIG. 4B is similar to the embodiment of the image 400A in FIG. 4A, except that the image 400B further includes a superimposed image of a reference pattern. In a non-limiting example, the reference pattern includes an array of boxes (e.g. 430). This figure demonstrates that the array of boxes can be used to guide alignment of the two patterns. In other embodiments, the reference pattern can include at least one of a point, a line, a corner, a box, a number, a mark or any other pattern that is suitable for alignment purposes.

As noted above, the reference pattern may be fixed to the wafer (e.g., by bonding to a backside or embedding within the wafer) or separate from the wafer (e.g., by use of a grid plate or incorporating the reference into a substrate holder). The fixed reference provides an advantage in that each individual pattern can be aligned on the wafer by using only the fixed reference pattern without considering the relative placement of other patterns previously formed on the wafer. However, special processing of the wafer to provide the fixed reference may be undesirable, in which case a separate reference such as a grid plate can be used. Where a separate grid plate is used, the overlay between two patterns may be calculated to account for changes in the position of the wafer relative to the grid plate when the wafer is moved between tools or processes.

Figure 4C:
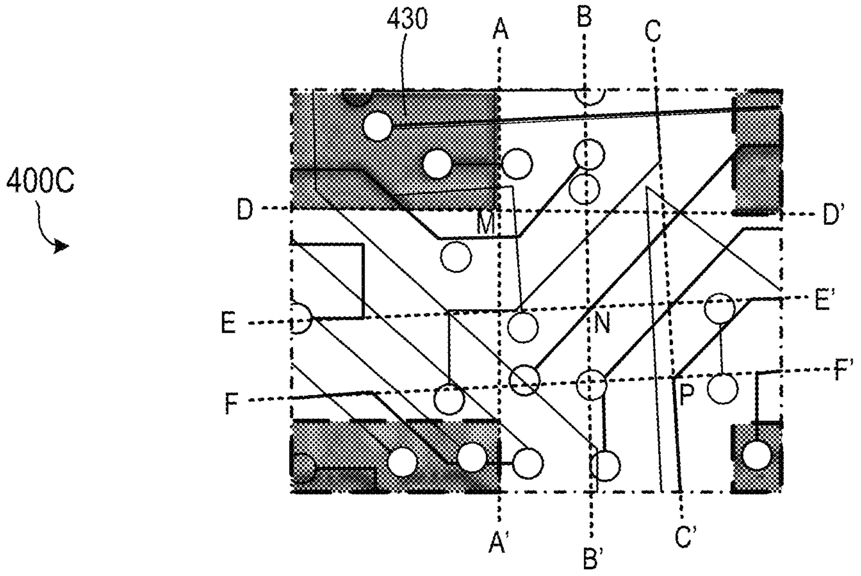
FIG. 4C shows a detailed view of the rectangle 400C in FIG. 4B, in accordance with exemplary embodiments of the present disclosure.
Figure 4D:
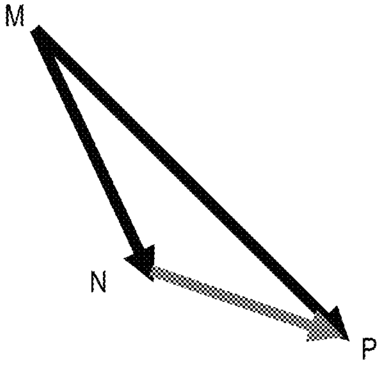
FIG. 4D shows overlay calculation using a reference pattern as shown in FIG. 4C, in accordance with exemplary embodiments of the present disclosure.

FIG. 4C shows a detailed view of the rectangle 400C in FIG. 4B, and FIG. 4D further demonstrates overlay calculation using the reference pattern in FIG. 4C, in accordance with exemplary embodiments of the present disclosure. FIGS. 4C and 4D show how an independent reference pattern can be used to calculate an overlay value of two patterns. This is done by knowing each common reference to a co-ordinate system and using that reference to know "where" each pattern is in that co-ordinate system. Once that is known, for example the distance between each layer, the vector calculation required to extract the overlay value is done with simple vector algebra. One can think of it as mix-match overlay (MMO) with a golden tool always there for oneself under the stage.

In a non-limiting example, a reference point M of the reference pattern is used to calculate an overlay value between a point N of a first pattern and a point P of a second pattern. Herein, boxes (e.g. 430) or lines (e.g. AA', BB', CC', DD', EE' and FF') are grid lines of a reference pattern. The point M is a corner of the box 430 as well as an intersection point of the lines AA' and DD'. The point N is an intersection point of the lines BB' and EE'. The point P is an intersection point of the lines CC' and FF'. This reference pattern can be imaged and precisely superimposed on an image of one or more patterns (e.g. the first pattern and the second pattern). Accordingly, by analyzing superimposed images, coordinate locations of patterns can be identified and then overlay calculated.

In a non-limiting example, the box 430 provides a reference point M that is absolute or wafer-independent. By superimposing a first pattern on the reference pattern, a coordinate difference or vector $\overrightarrow{MN}$ from the reference point M to the point N of the first pattern is determined. Likewise, by superimposing a second pattern on the reference pattern, a coordinate difference or vector $\overrightarrow{MP}$ from reference point M to the point P of the second pattern is determined. Then, an overlay value $\overrightarrow{NP}$ between the point N and the point P can be calculated: $\overrightarrow{NP}=\overrightarrow{MP}-\overrightarrow{MN}$. This overlay value may be useful for determining placement of the second pattern relative to the reference grid while also taking into account process deviations which affected placement of the first pattern.

Further, with coordinate locations of points (e.g. N) from the first pattern known and coordinate locations of points (e.g. P) from the second pattern known, an overlay value or shift from the first pattern to the second pattern can be determined. This overlay value can then be used to place the second or subsequent pattern to correct overlay relative to the independent reference grid. In some embodiments, having a reference image that is uniform for every image comparison enables correcting adjacent patterns as well as keeping overlay corrections based on an initial line or absolute reference. Note that in some embodiments, superimposing images is not necessary. Coordinate location data can be collected from the reference plate and the working surface of the wafer, and then vector analysis can be used to determine a gross offset or an overlay value.

FIG. 1 shows a flow chart of a process 100 for processing a wafer, in accordance with exemplary embodiments of the present disclosure. The process 100 starts with Step S110 where a reference pattern is provided for patterning a wafer, such as by placing the pattern below a working surface (e.g., a front side or a top surface) of a wafer. The reference pattern is independent of the working surface of the wafer. Herein, the reference pattern being independent of the working surface of the wafer means that the reference pattern is not affected by any manufacturing process performed on the working surface of the wafer. Such manufacturing processes typically include lithographic processes, such as etching, deposition, chemical mechanical polishing and the like. As a result, the reference pattern is also independent of one or more patterns formed on the working surface of the wafer.

The reference pattern includes at least one of a point, a line, a corner, a box, a triangle, a number, a mark or any other pattern that is suitable for alignment purposes. One embodiment includes using a grid plate under a wafer, though this is not a limitation. A grid plate may have grid lines and boxes formed by the grid lines. Intersection points of the grid lines or corners of the boxes can be used as reference points for overlay calculation as explicated in FIG. 4D. For example, a grid plate, manufactured by precision machining with 20 micron by 20 micron squares nearly perfectly aligned can be used.

In some embodiments, the reference pattern is incorporated in a reference plate positioned on a backside of the wafer. In one example, the reference plate is adhered to the backside of the wafer. Accordingly, the reference plate and the wafer can function as one module. In another example, the reference plate is incorporated in a substrate holder of a photolithography scanner or stepper. When a wafer having no pattern is placed over the reference plate, the wafer will be roughly aligned to the reference plate. When a wafer having an existing pattern is placed over the reference plate, the existing pattern and the reference plate can be co-axially aligned. In a conventional lithography process, measurement errors caused by wafer backside scratches, backside dust and/or substrate distortion due to heat, may impact overlay, but conventional overlay systems are often blind to these problems. Techniques herein include an independent reference plate and high spatial resolution to overcome these problems.

In some embodiments, the reference pattern is formed on a backside of the wafer. Other techniques can include embedding the reference pattern (e.g. grid lines) in a wafer such as using a radioactive or fluorescent material. In one example, a reference pattern is formed on a surface of a wafer, and then a layer of silicon and/or silicon oxide is deposited thereon. For instance, the layer of silicon and/or silicon oxide can have a thickness of 1-5 micrometers so that the reference pattern is effectively "embedded" in the wafer and patterns can be formed on the layer of silicon and/or silicon oxide. In another example, a reference pattern is formed on a backside of a wafer before a protection layer, such as silicon or silicon oxide is formed on the backside of the wafer. Consequently, the reference pattern is embedded in the wafer. In another example, the reference pattern may be formed on a front side of a carrier wafer before the front side of the carrier wafer is bonded to a backside of a target wafer. As a result, the reference pattern is sandwiched between the carrier wafer and the target wafer, which together function as one wafer.

The process 100 then proceeds to Step S120 where a placement of a first pattern on the working surface of the wafer is determined by identifying the reference pattern to align the first pattern. In some embodiments, an image of the reference pattern and an image of the first pattern are captured, and image analysis is performed to calculate an overlay value to determine the placement of the first pattern. For example, the image analysis can be accomplished by superimposing the image of the reference pattern and the image of the first pattern on each other, and identifying coordinate locations of the first pattern relative to the reference pattern. Alternatively, coordinate location data can be collected from the reference plate and the working surface of the wafer, and then vector analysis can be used to determine a gross offset or an overlay value. In some embodiments, the image analysis is performed in real time so that the placement of the first pattern can be adjusted in real time.

In some embodiments, light projection can also be used. For example, the reference can be a projected grid that does not physically exist in the wafer, on substrate holder or as a grid plate under the substrate holder. In some embodiments, the reference pattern may be a combination of physical marks and light projection. For example, physical reference marks may be provided on a peripheral region of a substrate holder that is not covered by a wafer placed on the substrate holder, and light projections can complete the reference pattern in the area of the wafer such that tunneling may not be necessary.

For a reference plate positioned under the wafer, embedded marks within the wafer, or embedded marks on a backside surface of the wafer, quantum tunneling imaging, IR transmission imaging or the like is used to image the reference pattern which is then compared with patterns formed on the working surface of the wafer.

Accordingly, an independent reference pattern can be used for patterning. The reference pattern can be considered as absolute in one way, and relative in another. For example, the reference pattern may keep or maintain fixed grid lines (or points or corners or boxes or any other suitable shapes) and is not changed from various deposition and etch steps on the wafer. In one embodiment, this can be a grid plate integrated with a stage or wafer holder. In this way the grid plate is absolute because the same physical grid plate is used throughout processing of the wafer, but relative because the physical grid plate is not fixed to the wafer itself and may be moved relative to the wafer throughout wafer processing. Although each time a given wafer is placed on the stage, it may be in a different location or orientation as compared to a previous placement; this does not matter. For a given new pattern to be placed or exposed, the wafer is imaged with the reference grid. The reference grid can then provide a relative reference point for identifying vectors to two or more points, from which vector analysis can be used to calculate an overlay correction adjustment in a next exposure. That is, the process of FIGS. 4C-4D can be used to mathematically correct for a change in relative position of the wafer and grid plate such that the grid plate can function in the same way as a fixed reference that is embedded in the wafer for example.

IR and UV sensors and sources are conventionally available and can be adapted for use with embodiments herein. In a non-limiting example, FLIR X8500 MWIR (Teledyne FLIR LLC, Oregon, USA) is a high-speed, high definition MWIR camera that can be used herein. For sensors, DataRay (DataRay Inc., California, USA) camera sensors can be used. An Optowaves (Optowares Inc., Massachusetts, USA) solid state lasers can be used, such as pumped nanosecond laser for surface imaging. For an IR source, IR tunable quantum cascade lasers from Pranalytica, Inc. (California, USA) can be used. These are example components. Others available systems can be substituted.

Techniques can include periodic calibration of relative positions of IR and UV, which is also referred to as relative position of red and blue calibration. It is beneficial to keep the relative position of IR and UV within a sensor dynamic range which is a few decades and as such quite forgiving. Normalization, however, can be done with a stage artifact of known relative transmission being imaged as needed. For example, once a day so that any relative intensity normalization can be conducted easily. Relative position or TIS tool induced shift calibrations are common to metrology stations. Relative position is re-calibrated against the grid plate in real time as measurements are made. A significant advantage of this system is always having a real time absolute reference. Digital image capture and regression can be used.

With deep ultra-violet (DUV) light, photoresist damage is negligible. For example, a 250 um field of view herein corresponds with about a 60 nm per pixel in the case of 4K resolution, which is sufficient for resolution of 0.1 nm registration error measurement. Having sufficient intensity of light source can mitigate any shadowing of metal layers.

At Step S130, the first pattern is formed on the working surface of the wafer based on the placement. In some embodiments, the process 100 further includes determining a placement of a second pattern on the working surface of the wafer by identifying the reference pattern to align the second pattern, and forming the second pattern on the working surface of the wafer. For example, determining the placement of the second pattern may be accomplished by identifying first coordinate locations of the first pattern relative to the reference pattern. Second coordinate locations of the second pattern are also identified relative to the reference pattern. An overlay value is then calculated using the first coordinate locations and the second coordinate locations. Subsequently, the second pattern is aligned using the overlay value. Additionally, the placement of the second pattern can be adjusted and aligned in real time by identifying the first coordinate locations of the first pattern and the second coordinate locations of the second pattern in real time.

In some embodiments, the process 100 further includes forming a stack of patterns on the working surface of the wafer, wherein placements of the stack of patterns are determined using the reference pattern. For example, coordinate locations of each pattern of the stack of patterns relative to the reference pattern are identified so that overlay values are calculated using the coordinate locations. The stack of patterns is thus aligned using the overlay values. Similarly, the placement of the stack of patterns can be adjusted and aligned in real time.

Figure 5:
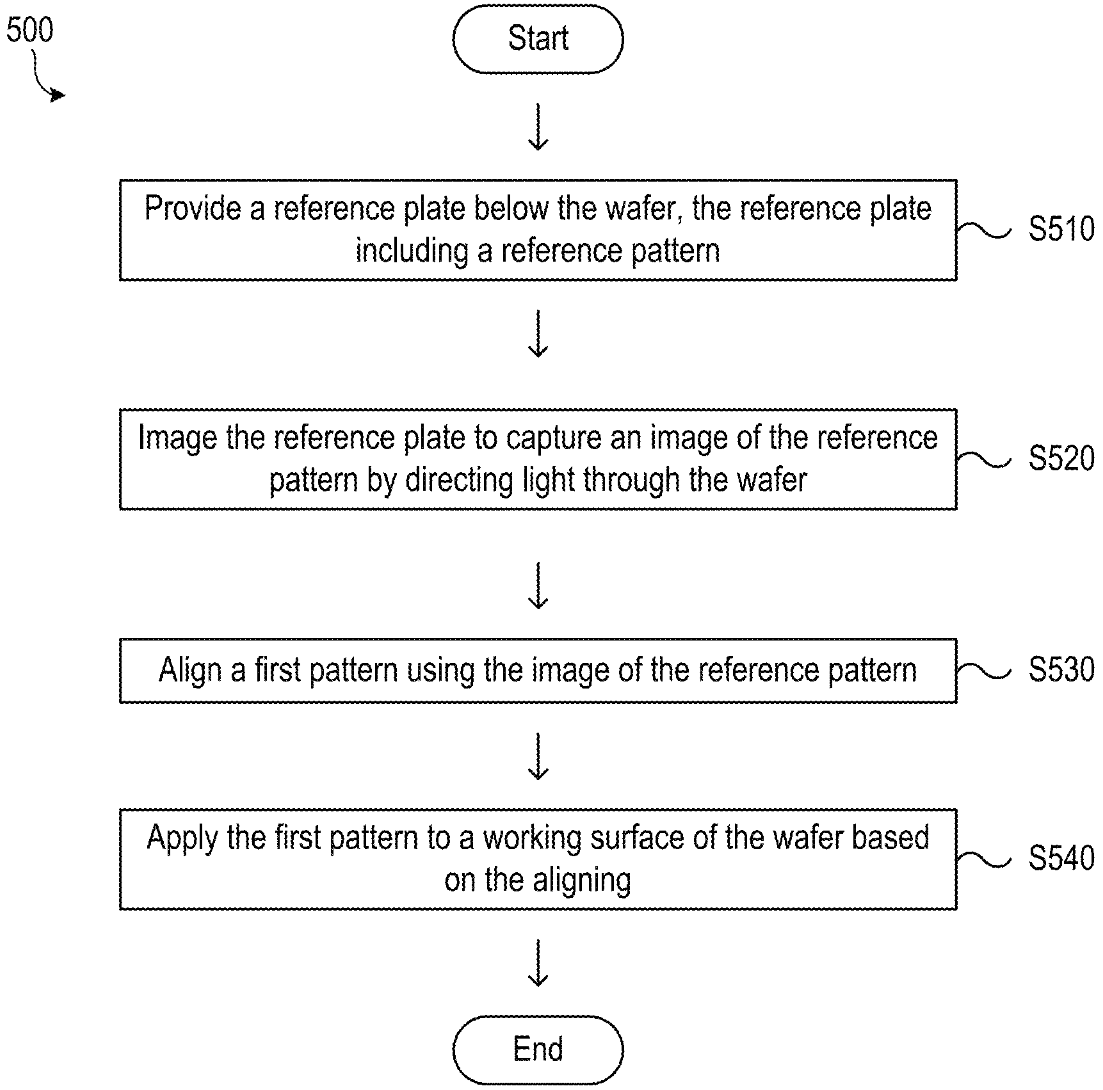
FIG. 5 shows a flow chart of an exemplary process for processing a wafer, in accordance with exemplary embodiments of the present disclosure.

FIG. 5 shows a flow chart of a process 500 for processing a wafer, in accordance with exemplary embodiments of the present disclosure. The process 500 starts with Step S510 where a reference plate is provided below the wafer. The reference plate includes a reference pattern. At Step S520, the reference plate is imaged, for example using quantum tunneling imaging, IR transmission imaging or the like, to capture an image of the reference pattern by directing light through the wafer. The process 500 then proceeds to Step S530 where a first pattern is aligned using the image of the reference pattern. At Step S540, the first pattern is applied to a working surface of the wafer based on the aligning.

In a non-limiting example, a first layer is formed on a wafer. The first layer has a photo-reactive species configured to receive a latent pattern via photolithography from a first pattern of actinic radiation. Alignment marks that are positioned below the wafer are then identified via quantum tunneling imaging, IR transmission imaging or the like. The photo-reactive species may be inactive to the quantum tunneling imaging, the IR transmission imaging or the like. Subsequently, the first layer is exposed to the first pattern of actinic radiation, and the first pattern of actinic radiation is aligned using the alignment marks positioned below the wafer. In some embodiments, the alignment marks are formed on a backside of the wafer or incorporated in a reference plate positioned below the wafer.

Since embodiments of the process 500 are similar to embodiments of the process 100 in FIG. 1, detailed descriptions will be omitted herein and emphasis will be placed on difference. In the process 100, a reference pattern is placed below a working surface of the wafer, where the reference pattern is independent of the working surface of the wafer. Thus, the reference pattern can be embedded within the wafer, formed on a backside of the wafer, or incorporated in a reference plate. In contrast, in the process 500, the wafer is positioned over a reference plate that includes the reference pattern.

Regarding possible concerns about CD variation effects for resist layers, techniques herein can extract coordinates of the patterns without pattern CD variation effects for a resist layer and an under-layer thereof (Metal resist patterns cover most of via patterns). Note that CD variation effects for resist layers are always an issue for alignment and is always ignored by overlay measurement teams as negligible in related examples. Techniques herein are far improved as the pattern itself is a far better indication of pattern placement than an alignment mark that suffers from CD's astigmatism and Zernike induced offset from pattern.

Techniques here include an inspection system and method. Techniques herein can see through a wafer as designed. A wafer scanning and imaging system is used that includes imaging through a wafer to a pattern below the wafer or a pattern within the wafer. This includes using light at a wavelength and intensity sufficient to quantum tunnel through or transmit through the wafer. Techniques herein can provide less than nanometer registration using both quantum cascade laser and visible light inspection. Inspection techniques herein can image and analyze overlay and defect without using conventional overlay and alignment marks. As scaling continues, on-wafer alignment marks are becoming too area hungry and they have inherent different optical distortion sensitivity from the main pattern making them unstable.

Techniques herein will wipe out the need for conventional overlay marks. The upper box is now the pattern and the lower box is just under the wafer. Techniques herein provide a totally different paradigm of overlay which requires no clear outs, no loss in real-estate, no complex scribe line design making silicon area utilization improved and not complex integrations for alignment marks. The best part is that your reference mark is not being impacted and wiped out by unfavorable processes that are making devices instead of the alignment marks, as they often are conventionally. Overlay placement accuracy can also now be measured from the very first layer, as your first reference layer is now not only near perfect every time but hidden right under the stage there always.

By way of a non-limiting embodiment, a highly accurate and precise grid plate can be used. One example can be a grid plate with 20 micron by 20 micron squares, nearly perfectly aligned. Techniques then resolve 20 um grid fiducials with QCL optical system using a few um wavelength. The infrared resolution capability is sufficient for this because resolution is a function of wavelength. 2-3 um features with a "k" resolution factor of 1.0 which is considered very easy and thus is able to image grid marks on the order of 2-3 um. With the example grid marks being ten times larger at 20 um, they are accurately resolved.

Techniques herein provide high positional accuracy of the reference plate. For example, the grid plate with 20 micron by 20 micron squares can be placed with sub-nm positional accuracy or uncertainty. It is not the size of the mark that makes the grid special, but instead it is the knowledge of accuracy or uncertainty of the reference mark placement to sub nm that is important. That is, while the squares of the reference pattern are on the order of 20 microns and the feature size of a pattern to be formed on the wafer may be on the order of a few nanometers, a reference point of a square (e.g. the point M in FIG. 4C) rather than an entire square (e.g. the box 430 in FIG. 4C) can be used for overlay calculation. Because the overlay value between the point N and the point P is calculated by using the point M as a reference point, the positional uncertainty of the point M is integrated into the calculated overlay value. When the calculated overlay value is on the order of a few nanometers or more, a sub-nm positional uncertainty of the point M is negligible. Hence, it is important and advantageous to ensure the positional accuracy of the reference pattern. A sub-nm positional accuracy is highly desirable but may also be unnecessary, depending on specific patterns to be formed in various applications.

Techniques herein provide real-time imaging, overlay calculation and pattern alignment. A position of the wafer can be actively determined using the reference pattern. Positions of any previously formed patterns on the working surface of the wafer can also be actively determined using the reference pattern. Calculations can then be used to adjust a position of a pending exposure. In related examples, when moving from one area of the wafer to another area of the wafer (e.g. stepping), one needs to search for alignment marks and stop moving when finding the alignment marks. Images are usually acquired so as to adjust focus, and the stage may be settled. This series of operations can be time-consuming, particularly for a "step-and-repeat" or "step-and-scan" system in projection printing. Nevertheless, in the present disclosure, images are taken and analyzed in real time to constantly determine where the relative location is. As a matter of fact, every image taken is a snapshot of overlay. One needs only to track positional data from the reference pattern and re-create the high spatial terms of the overlay map digitally from the image analysis. Therefore, there is no "step", "search", "acquire", "stop", "settle" or "focus" in contrast to related examples. Techniques herein enable high-speed measurement.

In some embodiments a color filter can be used to only detect fluorescence of the resist resin to enhance the pattern from the resist.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of processing a wafer, the method comprising:

providing a reference pattern for patterning a wafer, wherein the reference pattern is independent of a working surface of the wafer;

determining a placement of a first pattern on the working surface of the wafer by identifying the reference pattern to align the first pattern; and forming the first pattern on the working surface of the wafer based on the placement, wherein determining the placement of the first pattern further comprises capturing an image of the reference pattern and an image of the first pattern, performing image analysis to calculate a first overlay value to determine the placement of the first pattern, and identifying first coordinate locations of the first pattern relative to the reference pattern.

2. The method of claim 1, further comprising:

determining a placement of a second pattern on the working surface of the wafer by identifying the reference pattern to align the second pattern; and forming the second pattern on the working surface of the wafer.

3. The method of claim 2, wherein determining the placement of the second pattern further comprises:

identifying second coordinate locations of the second pattern relative to the reference pattern;

calculating a second overlay value using the first coordinate locations and the second coordinate locations; and aligning the second pattern using the second overlay value.

4. The method of claim 1, further comprising forming a stack of patterns on the working surface of the wafer, wherein placements of the stack of patterns are determined using the reference pattern.

5. The method of claim 4, further comprising:

identifying coordinate locations of each pattern of the stack of patterns relative to the reference pattern;

calculating overlay values using the coordinate locations; and aligning the stack of patterns using the overlay values.

6. The method of claim 1, wherein the reference pattern is formed on a backside of the wafer or embedded with the wafer.

7. The method of claim 6, further comprising:

capturing an image of the reference pattern and an image of the first pattern simultaneously; and capturing the image of the reference pattern via quantum tunneling imaging or JR transmission imaging.

8. The method of claim 1, wherein the reference pattern includes a radioactive or fluorescent material.

9. The method of claim 1, wherein the reference pattern includes at least one of a point, a line, a corner, a box, a triangle, a number or a mark.

10. The method of claim 1, wherein the reference pattern is coaxially aligned with the wafer.

11. The method of claim 1, wherein the reference pattern is projected on a surface of the wafer.

12. A method of processing a wafer, the method comprising:

providing a reference pattern for patterning a wafer, wherein the reference pattern is independent of a working surface of the wafer and is incorporated in a reference plate positioned below the wafer;

determining a placement of a first pattern on the working surface of the wafer by identifying the reference pattern to align the first pattern;

capturing an image of the reference pattern and an image of the first pattern simultaneously; and forming the first pattern on the working surface of the wafer based on the placement.

13. The method of claim 12, further comprising capturing the image of the reference pattern via quantum tunneling imaging or infrared (IR) transmission imaging.

14. The method of claim 12, wherein the reference plate is incorporated in a substrate holder of a photolithography scanner or stepper.

15. The method of claim 12, wherein the reference plate is placed on or adhered to a backside of the wafer.

16. The method of claim 12, further comprising:

determining a placement of a second pattern on the working surface of the wafer by identifying the reference pattern to align the second pattern; and forming the second pattern on the working surface of the wafer.

17. The method of claim 16, wherein determining the placement of the second pattern further comprises:

identifying first coordinate locations of the first pattern relative to the reference pattern;

identifying second coordinate locations of the second pattern relative to the reference pattern;

calculating an overlay value using the first coordinate locations and the second coordinate locations; and aligning the second pattern using the overlay value.

18. A method of processing a wafer, the method comprising:

accessing a reference pattern for patterning the wafer, wherein the reference pattern is independent of a first pattern formed on the wafer;

identifying first coordinate locations of the first pattern relative to the reference pattern;

identifying second coordinate locations of a second pattern relative to the reference pattern; and calculating an overlay value using the first coordinate locations and the second coordinate locations, wherein identifying the first coordinate locations and the second coordinate locations includes using image analysis.

19. The method of claim 18, wherein the reference pattern is formed on a backside of the wafer or embedded with the wafer.

20. The method of claim 19, further comprising:

capturing an image of the reference pattern and an image of the first pattern simultaneously; and capturing the image of the reference pattern via quantum tunneling imaging or IR transmission imaging.

* * * * *

UNITED STATES PATENT AND TRADEMARK OFFICE

CERTIFICATE OF CORRECTION

PATENT NO. : 11,966,171 B2
APPLICATION NO. : 17/404566
DATED : April 23, 2024
INVENTOR(S) : Devilliers It is certified that error appears in the above-identified patent and that said Letters Patent is hereby corrected as shown below:

In the Claims

In Column 15, Claim 7, Line 65, delete “JR” and insert -- IR --, therefor.

Signed and Sealed this
Third Day of September, 2024

Katherine Kelly Vidal

Katherine Kelly Vidal
*Director of the United States Patent and Trademark Office*